(12) United States Patent
Park

(10) Patent No.: US 10,990,327 B2
(45) Date of Patent: Apr. 27, 2021

(54) STORAGE DEVICE AND METHOD OF OPERATING THE SAME

(71) Applicant: SAMSUNG ELECTRONICS CO., LTD., Suwon-si (KR)

(72) Inventor: Sang-Ryong Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/687,265

(22) Filed: Nov. 18, 2019

(65) Prior Publication Data

US 2020/0159464 A1 May 21, 2020

(30) Foreign Application Priority Data

Nov. 19, 2018 (KR) .......................... 10-2018-0142510

(51) Int. Cl.
| | | |
|---|---|---|
| *G11C 7/00* | (2006.01) | |
| *G06F 3/06* | (2006.01) | |
| *G11C 16/26* | (2006.01) | |
| *H03M 13/11* | (2006.01) | |
| *G11C 16/04* | (2006.01) | |

(52) U.S. Cl.
CPC .......... *G06F 3/0679* (2013.01); *G06F 3/0626* (2013.01); *G06F 3/0634* (2013.01); *G06F 3/0653* (2013.01); *G06F 3/0656* (2013.01); *G06F 3/0659* (2013.01); *G11C 16/0483* (2013.01); *G11C 16/26* (2013.01); *H03M 13/1111* (2013.01)

(58) Field of Classification Search
CPC ....... G11C 7/1057; G11C 7/1078; G11C 7/22; G11C 7/106; G11C 7/1051
USPC ............................................ 365/189.05, 201
See application file for complete search history.

(56) References Cited

U.S. PATENT DOCUMENTS

| | | |
|---|---|---|
| 9,036,412 B2 | 5/2015 | Choi et al. |
| 9,190,160 B2 | 11/2015 | Ok et al. |
| 9,836,219 B2 | 12/2017 | Kim et al. |
| 10,019,188 B2 | 7/2018 | Chung et al. |
| 10,090,046 B2 | 10/2018 | Park et al. |
| 10,120,589 B2 | 11/2018 | Jung |
| 10,152,380 B2 | 12/2018 | Yim et al. |
| 10,163,518 B2 | 12/2018 | Yoon et al. |
| 2015/0332777 A1 | 11/2015 | Yoon et al. |

(Continued)

FOREIGN PATENT DOCUMENTS

| | | |
|---|---|---|
| KR | 10-2014-0020041 A | 2/2014 |
| KR | 10-2016-0005264 A | 1/2016 |

(Continued)

*Primary Examiner* — Son T Dinh
(74) *Attorney, Agent, or Firm* — Volentine, Whitt & Francos, PLLC

(57) ABSTRACT

A memory controller includes an error correction code (ECC) module for performing ECC decoding based on read data received from a non-volatile memory device for performing an on-chip valley search (OVS) read operation. A read voltage modification module receives status bits representing a latch that latches the read data among a plurality of latches included in the non-volatile memory device to store result values of the OVS read operation and determine whether to change a read voltage based on the status bits when the ECC decoding is successfully performed.

20 Claims, 13 Drawing Sheets

(56) References Cited

U.S. PATENT DOCUMENTS

2016/0034351 A1* 2/2016 Michael .............. G06F 12/0246
714/758
2017/0235633 A1    8/2017 Park
2018/0102790 A1    4/2018 Oh et al.

FOREIGN PATENT DOCUMENTS

| KR | 10-2016-0055309 A | 5/2016 |
| KR | 10-2016-0101751 A | 8/2016 |
| KR | 10-2017-0054634 A | 5/2017 |
| KR | 10-2017-0097267 A | 8/2017 |
| KR | 10-2018-0040288 A | 4/2018 |

* cited by examiner

FIG. 9

| CMD_70 | MAT1 | | MAT2 | | CONTENT |
|---|---|---|---|---|---|
| | DQ0 | DQ1 | DQ2 | DQ3 | |
| STATUS READ | 0 | 0 | 0 | 0 | SECOND STATE |
| | 0 | 1 | 0 | 1 | THIRD STATE |
| | 1 | 0 | 1 | 0 | FIRST STATE |

FIG. 12

| CMD_70 | DQ0 | DQ1 | CASE |
|---|---|---|---|
| STATUS READ | 0 | 0 | THIRD STATE |
| | 0 | 1 | SECOND STATE |
| | 1 | 0 | FIRST STATE |

| CMD_70 | ON-CELL COUNT OF FIRST LATCH | CONTENT |
|---|---|---|
| | DQ2 | |
| STATUS READ | 0 | LOW |
| | 1 | OVER |

| CMD_70 | ON-CELL COUNT OF THIRD LATCH | CONTENT |
|---|---|---|
| | DQ3 | |
| STATUS READ | 0 | LOW |
| | 1 | OVER |

STORAGE DEVICE AND METHOD OF OPERATING THE SAME

CROSS-REFERENCE TO RELATED APPLICATION

This application claims the benefit of Korean Patent Application No. 10-2018-0142510, filed on Nov. 19, 2018, in the Korean Intellectual Property Office, the disclosure of which is incorporated herein in its entirety by reference.

BACKGROUND

The disclosure relates to a storage device, and more particularly, to a storage device for changing a read voltage and a method of operating the same.

A semiconductor memory device is implemented by using a semiconductor such as silicon (Si), germanium (Ge), gallium arsenide (GaAs), or indium phosphide (InP). The semiconductor memory device may be classified into a volatile memory device and a non-volatile memory device.

On the other hand, as the semiconductor memory device is requested to have a high capacity, in order to improve a degree of integration, a multi-leveling method of increasing the number of bits stored by cell and a scaling method of reducing a circuit line width are used. As the number of bits stored by cell increases, overlap of a threshold voltage distribution increases and the circuit line width is reduced. Accordingly, a distance between neighboring memory cells is reduced and coupling is generated. Therefore, it may be requested to correctly read data based on an ideal read voltage.

SUMMARY

The disclosure provides a non-volatile memory device for estimating a distribution movement of threshold voltages by using status bits during an on-chip valley search (OVS) read operation and a method of operating the same.

The disclosure also provides a non-volatile memory device for changing a read voltage based on the distribution movement of the threshold voltages, which is estimated by using the status bits, although error correcting code (ECC) decoding is successfully performed, and a method of operating the same.

According to an aspect of the disclosure, there is provided a storage device including a memory controller and a non-volatile memory device. The non-volatile memory device includes a memory cell array including a plurality of memory cells, a page buffer including a plurality of latches for performing a plurality of sensing operations on memory cells selected among the plurality of memory cells and storing result values of the plurality of sensing operations, a control logic for comparing data stored in each of the plurality of latches, selecting one latch from among the plurality of latches in accordance with a result of the comparing of the data, transmitting read data stored in the selected latch to the memory controller, and generating status bits representing the selected latch from among the plurality of latches, and a status bit register for storing the generated status bits and transmitting the status bits to the memory controller when a status read command is received from the memory controller. The memory controller performs an error correction code (ECC) decoding on the transmitted read data and determines whether to change a read voltage based on the status bits when the ECC decoding is successfully performed.

According to another aspect of the disclosure, there is provided a memory controller including an ECC module for performing ECC decoding based on read data received from a non-volatile memory device for performing an OVS read operation and a read voltage modification module for receiving status bits representing a latch that latches the read data among a plurality of latches included in the non-volatile memory device to store a result value of the OVS read operation and determining whether to change a read voltage based on the status bits when the ECC decoding is successfully performed.

According to another aspect of the disclosure, there is provided a method of operating a memory controller, including receiving read data and status bits representing a latch from which the read data is output among a plurality of latches from a non-volatile memory device for performing an OVS read operation, performing ECC decoding based on the read data, and determining whether to change a read voltage based on the status bits when the ECC decoding is successfully performed.

BRIEF DESCRIPTION OF THE DRAWINGS

Embodiments of the disclosure will be more clearly understood from the following detailed description taken in conjunction with the accompanying drawings in which:

FIG. 9 is a table illustrating status bits according to an exemplary embodiment of the disclosure;

FIG. 12 is a table illustrating status bits according to an exemplary embodiment of the disclosure.

DETAILED DESCRIPTION OF THE EMBODIMENTS

Figure 1:
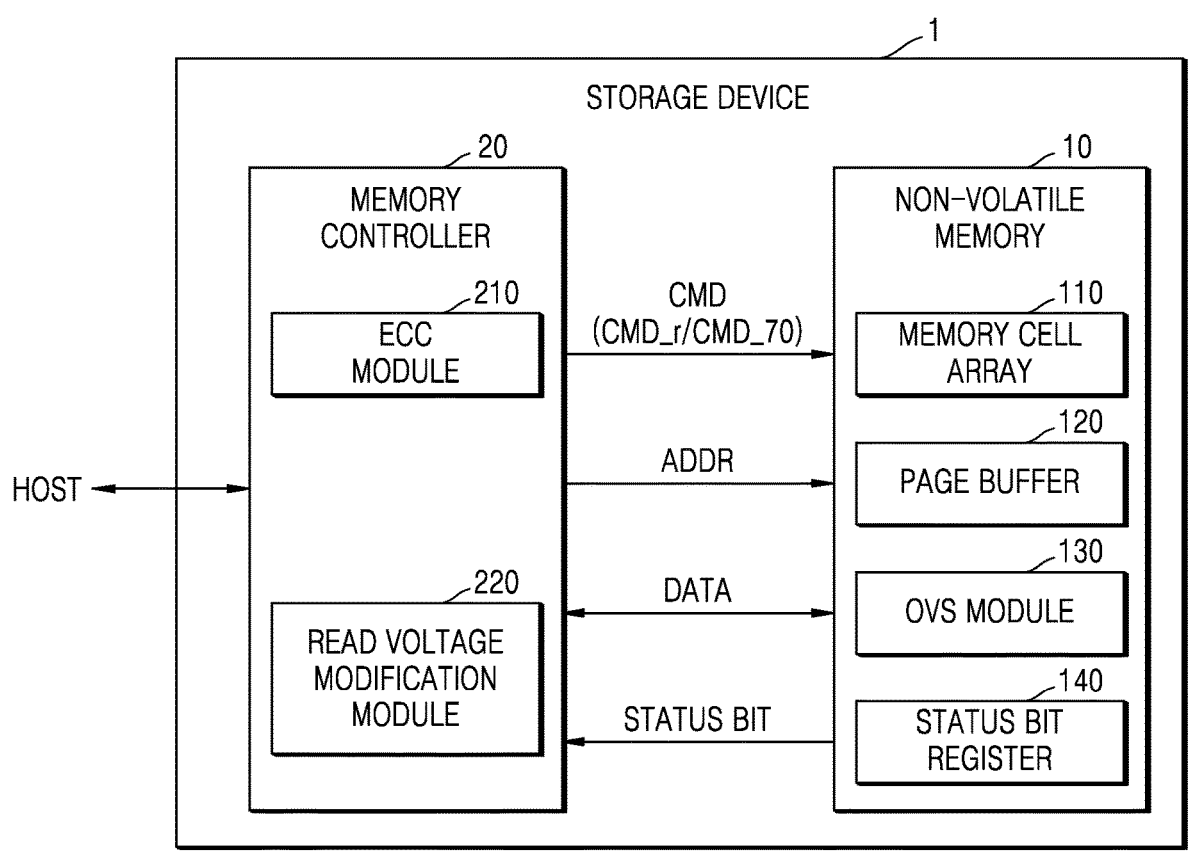
FIG. 1 is a block diagram illustrating a storage device according to an exemplary embodiment of the disclosure.

FIG. 1 is a block diagram illustrating a non-volatile memory system according to an exemplary embodiment of the disclosure.

Referring to FIG. 1, a storage device 1 may include a memory controller 20 and a non-volatile memory device 10. In an example, a host HOST, the memory controller 20, and the non-volatile memory device 10 may be respectively provided as a chip, a package, and a module.

The memory controller 20 may control the non-volatile memory device 10 in response to a write request or a read request received from the host HOST. For example, the memory controller 20 may transmit a command CMD and an address ADDR to the non-volatile memory device 10 in response to the write request or the read request received from the host HOST. The address ADDR transmitted by the memory controller 20 to the non-volatile memory device 10 may be a physical address of the non-volatile memory device 10. The memory controller 20 may transmit data DATA to and receive data DATA from the non-volatile memory device 10. In an example, when the command CMD is a write command CMD_70, the non-volatile memory device 10 may write the data DATA received from the memory controller 20 in a memory cell array 110 and, when the command CMD is a read command CMD_r, the non-volatile memory device 10 may output the data DATA stored in the address ADDR received from the memory controller 20 to the memory controller 20.

The non-volatile memory device 10 according to an embodiment of the disclosure may include the memory cell array 110, a page buffer 120, an on-chip valley search (OVS) module 130, and a status bit register 140.

The memory cell array 110 may include a plurality of memory cells. For example, the plurality of memory cells may be flash memory cells. Hereinafter, embodiments will be described in detail taking a case in which the plurality of memory cells are NAND flash memory cells as an example. However, the disclosure is not limited thereto. In another embodiment, the plurality of memory cells may be resistive memory cells such as resistive random-access memory (RRAM), phase change RAM (PRAM), or magnetic RAM (MRAM).

In an embodiment according to the disclosure, each memory cell included in the memory cell array 110 may store data of no less than 2-bits. For example, the memory cell may be a multilevel cell (MLC) that stores 2-bit data. In another example, the memory cell may be a triple level cell (TLC) that stores 3-bit data or a quadruple level cell (QLC) that stores 4-bit data. However, the disclosure is not limited thereto. In another embodiment, partial memory cells included in the memory cell array 110 are single level cells (SLC) that store 1-bit data and remaining memory cells excluding the partial memory cells may be MLCs.

The page buffer 120 may include a write driver and a sense amplifier. During a write operation, the page buffer 120 may transmit a bit line voltage corresponding to data to be written in a bit line of the memory cell array 110. During a read operation or a verify operation, the page buffer 120 may sense data stored in a selected memory cell through the bit line. The page buffer 120 may include a plurality of latches connected to at least one bit line.

The OVS module 130 may perform a plurality of sensing operations performed in order to determine a certain state stored in the memory cells. The OVS module 130 may store result values sensed by the plurality of sensing operations in the plurality of latches included in the page buffer 120. The OVS module 130 may output data sensed and latched by a distribution valley voltage among the data items stored in the plurality of latches as read data by comparing the result values sensed by the plurality of sensing operations, as described later in FIG. 3.

The status bit register 140 may store status bits. The status bits may represent a state of the non-volatile memory device 10. According to various embodiments, the status bits may be generated by a control logic 100. For example, the status bits may be generated by the OVS module 130 included in the control logic 100. In another example, the status bits may be generated by the status bit register 140 based on a control signal Info_Sel of the control logic 100. The status bits may represent a "busy" or "ready" state of the non-volatile memory device 10. For example, while the non-volatile memory device 10 performs an OVS read operation, the status bits may represent "busy". In another example, after the non-volatile memory device 10 completes the OVS read operation, the status bits may represent "ready". The "ready" or "busy" state may correspond to "1" or "0" of a bit transmitted through, for example, a pin DQ6 among the status bits. In another embodiment, the status bits may represent a latch selected to output the read data among the plurality of latches. That is, when the non-volatile memory device 10 is in a "ready" state, the status bits may further include bits indicating a result of the completed OVS read operation. The status bits indicating the selected latch may include bits transmitted through, for example, pins DQ0 to DQ3. For example, when data latched to a first latch is output as the read data in accordance with a first sensing operation, the status bit register 140 may store status bits "1010" representing the first latch. For example, when data stored in a second latch is output as the read data in accordance with a second sensing operation among the plurality of sensing operations, the status bit register 140 may store status bits "0000" representing the second latch. For example, when data stored in a third latch is output as the read data in accordance with a third sensing operation among the plurality of sensing operations, the status bit register 140 may store status bits "0101" indicating the third latch. According to various embodiments, the status bit register 140 may transmit the status bits to the memory controller 20 in response to a status read command received from the memory controller 20, as described later with reference to FIGS. 7 and 8.

The memory controller 20 according to an embodiment of the disclosure may include an error correcting code (ECC) module 210 and a read voltage modification module 220.

The ECC module 210 may perform ECC encoding or decoding on input and output data. For example, the ECC module 210 receives a write command from the host HOST and may perform the ECC encoding on write data. For example, the ECC module 210 receives the read data from the non-volatile memory device 10 and may perform the ECC decoding. According to an embodiment, when the ECC module 210 fails to decode the read data, the ECC module 210 may request the non-volatile memory device 10 to perform read retry. When the ECC module 210 succeeds to decode the read data, the ECC module 210 may output the decoded read data to the host HOST.

The read voltage modification module 220 may determine whether to change a read voltage. According to an embodiment, the read voltage modification module 220 may determine whether to change the read voltage based on status bits. The read voltage modification module 220 may determine a latch selected to output the read data and may increase or reduce the read voltage based on the identified latch by using the status bits. According to an embodiment, when the read voltage modification module 220 succeeds to perform ECC decoding, it may be determined that the read voltage is to be modified, as described later in FIGS. 10 and 11.

Figure 2:
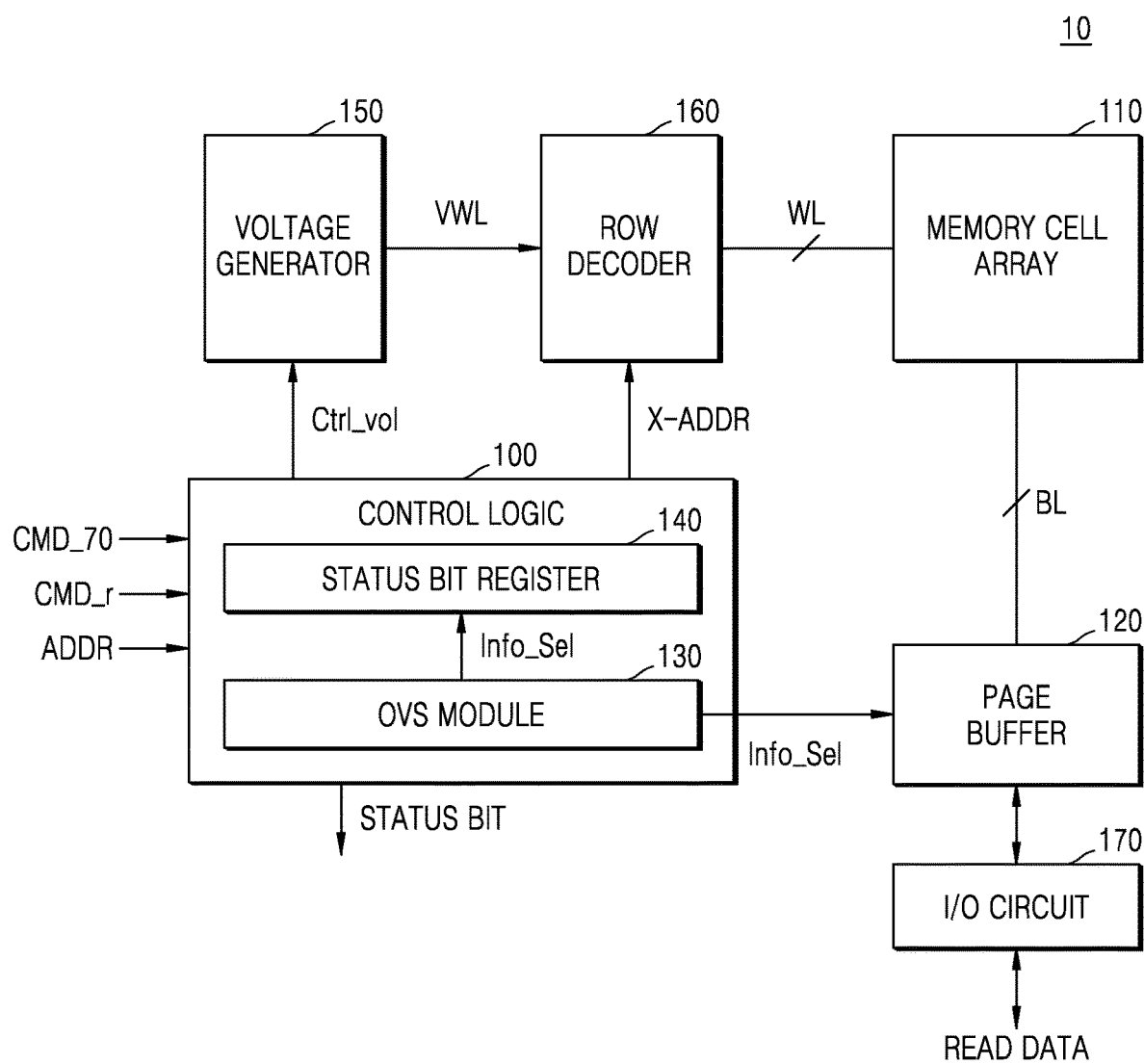
FIG. 2 is a block diagram illustrating a non-volatile memory device according to an exemplary embodiment of the disclosure.

FIG. 2 is a block diagram illustrating a non-volatile memory device according to an exemplary embodiment of the disclosure. Descriptions that are the same as those already given with reference to FIG. 1 are omitted.

Referring to FIG. 2, the non-volatile memory device 10 may include the control logic 100, the memory cell array 110, the page buffer 120, a voltage generator 150, a row decoder 160, and an input and output circuit 170.

The control logic 100 may include the OVS module 130 and the status bit register 140. The control logic 100 may output various control signals for writing data in the memory cell array 110 or reading data from the memory cell array 110 based on the commands CMD_70 and CMD_r and the address ADDR that are received from the memory controller 20 (FIG. 1).

The OVS module 130 may perform the plurality of sensing operations on a memory cell. The OVS module 130 may respectively store the values sensed by the plurality of sensing operations in the plurality of latches included in the page buffer 120. The plurality of sensing operations may be performed at different points in time. According to an embodiment, the plurality of sensing operations may include three sensing operations. For example, the data obtained by the first sensing operation performed at a first point in time may be stored in the first latch among the plurality of latches. For example, the data obtained by the second sensing operation may be stored in the second latch among the plurality of latches and the second sensing operation may be performed at a second point of time later than the first point of time. For example, the data obtained by the third sensing operation may be stored in the third latch among the plurality of latches and the third sensing operation may be performed at a third point of time later than the second point of time.

According to various embodiments, the OVS module 130 selects one of the plurality of latches and may output data stored in the selected latch as the read data. According to an embodiment, the OVS module 130 compares the data stored in the first latch with the data stored in the second latch and may compare the data stored in the second latch with the data stored in the third latch. The OVS module 130 may select a latch that stores data read in accordance with an ideal read voltage based on the comparison, as described later in FIG. 3.

The page buffer 120 may include the plurality of latches. The plurality of latches may store results of the sensing operations performed at different points in time. According to an embodiment of the disclosure, the plurality of latches receives the control signal Info_Sel from the OVS module 130 and may output, through bit lines BL, data stored in a latch represented by the control signal Info_Sel as the read data. Each of the plurality of latches may select or output ideal data among a plurality of data items sensed in accordance with control of the control logic 100.

The voltage generator 150 may generate various kinds of voltages for performing write, read, and erase operations on the memory cell array 110 based on the voltage control signal Ctrl_vol. In detail, the voltage generator 150 may generate a word line voltage VWL, for example, a program voltage (or a write voltage), the read voltage, a pass voltage (or a word line non-selection voltage), a verify voltage, or a recovery voltage.

The row decoder 160 may select partial word lines among word lines WL in response to a row address X-ADDR. The row decoder 160 transmits the word line voltage VWL to the word lines WL. During a program operation, the row decoder 160 may apply the program voltage and the verify voltage to the selected word lines and may apply a program inhibit voltage to non-selected word lines. During the read operation, the row decoder 160 may apply the read voltage to the selected word lines and may apply a read inhibit voltage to the non-selected word lines. During the recovery operation, the row decoder 160 may apply the recovery voltage to the selected word lines. In addition, the row decoder 160 may select partial string selection lines among string selection lines or partial ground selection lines among ground selection lines in response to the row address X-ADDR.

The input and output circuit 170 receives data, READ DATA, from the outside (for example, the memory controller 20 of FIG. 2) and stores the received data in the memory cell array 110. In addition, the input and output circuit 170 reads data from the memory cell array 110 and may output the read data to the outside.

Figure 3:
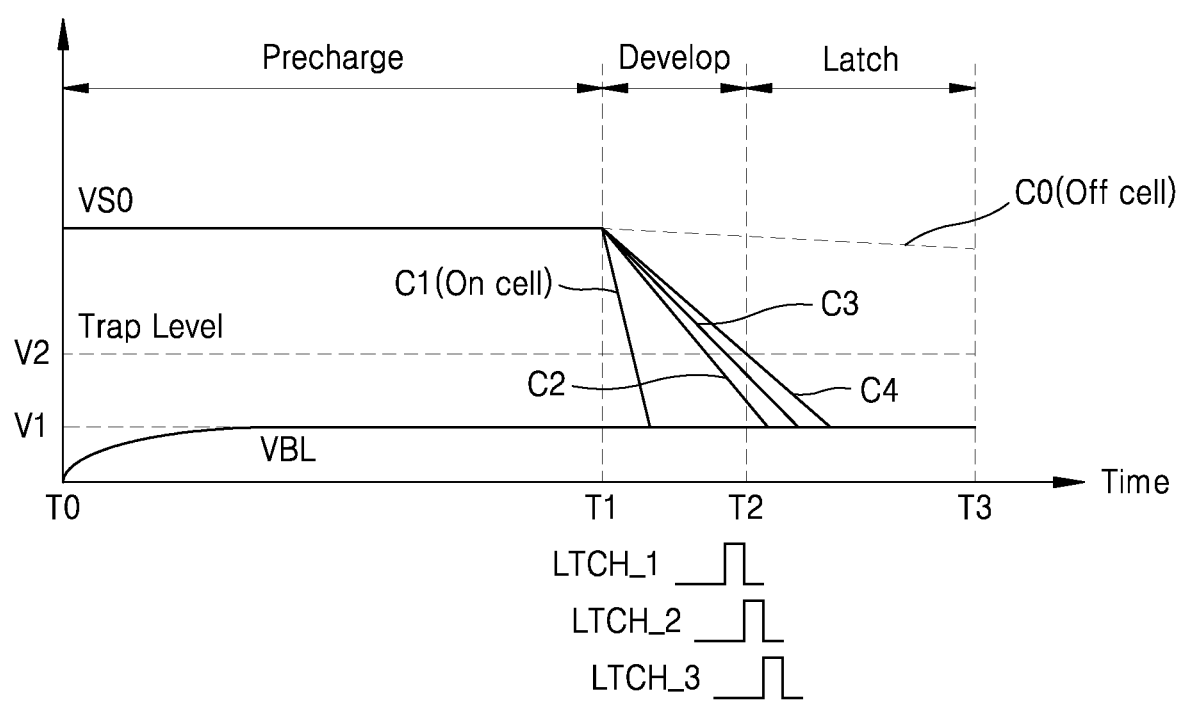
FIG. 3 is a waveform diagram illustrating a change in level of a sensing node while performing an on-chip valley search (OVS) read operation according to an exemplary embodiment of the disclosure.

FIG. 3 is a waveform diagram illustrating a change in level of a sensing node while performing an on-chip valley search (OVS) read operation according to an exemplary embodiment of the disclosure.

In FIG. 3, it is described that the three sensing operations are performed. However, the disclosure is not limited thereto. Referring to FIG. 3, a period from a point of time T0 to a point of time T1 may be referred to as a pre-charge period Precharge, a period from the point of time T1 to a point of time T2 may be referred to as a develop period Develop, and a period after the point of time T2 may be referred to as a latch period Latch.

In the pre-charge period Precharge, the bit line voltage VBL may be charged at a first voltage level V1 and the sensing node may be charged by a sensing node voltage VS0. At the point of time T1 at which the develop period starts, charges charged in the sensing node may move to the bit lines. In a strong off cell having a threshold voltage higher than the read voltage, a change in level of the sensing node may be small. A change in electric potential of the sensing node of the strong off cell in the develop period Develop is illustrated as a dashed line C0.

In a strong on cell having a threshold voltage lower than the read voltage, the change in level of the sensing node may be large. A change in voltage level of the sensing node of the strong on cell in the develop period Develop is illustrated as a first curve C1. The strong off cell or the strong on cell may not be remarkably affected by a small change in sensing time. Changes in electric potentials of the sensing node that senses memory cells having threshold voltages positioned around the read voltage are illustrated as second to fourth curves C2, C3, and C4. The second curve C2 illustrates the development tendency of memory cells having threshold voltages slightly lower than the read voltage. The third curve C3 illustrates the development tendency of memory cells having threshold voltages at levels similar to a level of the read voltage. The fourth curve C4 may illustrate the development tendency of memory cells having threshold voltages slightly higher than the read voltage.

In accordance with multi-sensing, a first latch signal LTCH_1 for latching the sensing node of the memory cells by advancing a latch point of time by a previously determined point of time based on a point of time T2 may be provided. When the sensing node is latched by the first latch signal LTCH_1, in the strong off cell C0 and the strong on cell C1, the latches may be set by logic values corresponding to the off cell and the on cell. However, the memory cells corresponding to the second curve C2, which have the low threshold voltages, may be latched to a logic value corresponding to an on cell. On the other hand, the memory cells corresponding to the third and fourth curves C3 and C4 may be latched to a logic value corresponding to an off cell.

When the sensing node is latched by a second latch signal LTCH_2, like in the first latch signal LTCH_1, in the strong off cell C0 and the strong on cell C1, logic '0' and logic '1' may be latched. However, the memory cells having the threshold voltages corresponding to the second curve C2 may be latched by the logic value corresponding to the on cell. On the other hand, in the memory cells corresponding to the third curve C3, a trap level V2 with the unclear logic '0' and logic '1' may be latched by the second latch signal LTCH_2. The memory cells corresponding to the fourth curve C4 may be latched by the logic value corresponding to the off cell by the second latch signal LTCH_2.

When the sensing node is latched by a third latch signal LTCH_3, like in the first latch signal LTCH_1, in the strong off cell C0 and the strong on cell C1, the logic '0' and logic '1' may be latched. However, the memory cells having the threshold voltages corresponding to the second and third curves C2 and C3 may be latched to the logic value '1' corresponding to the on cell. The memory cells corresponding to the fourth curve C4 may be latched to the logic value '0' corresponding to the off cell by the third latch signal LTCH_3.

Like in the above-described method, by latching a state of the sensing node to a logic value at a varying develop point of time in order to determine a certain state, a similar effect to applying a read voltage at a varying level to word lines in accordance with a develop point of time may be obtained.

Figure 4:
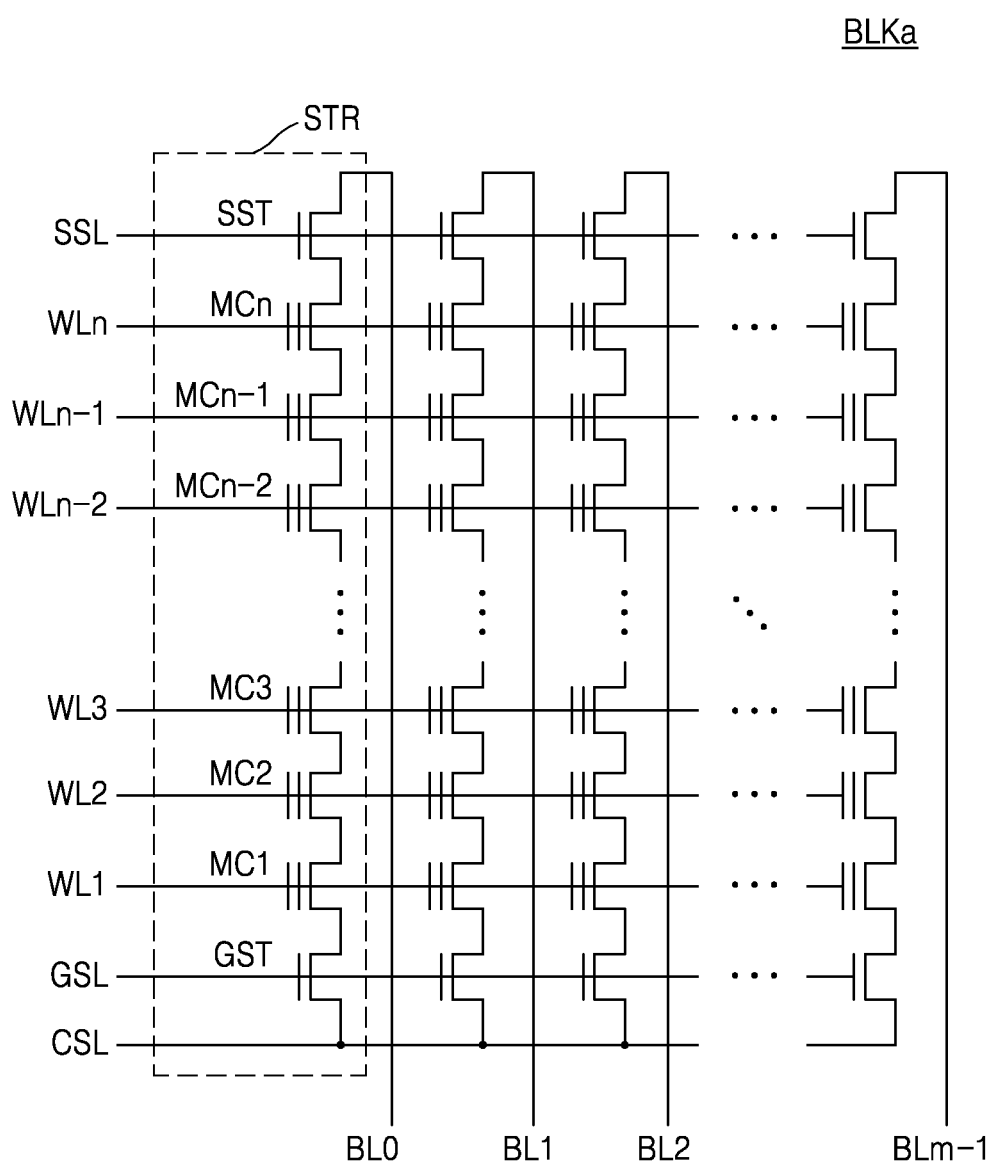
FIG. 4 is a circuit diagram illustrating a memory block included in a memory cell array according to an exemplary embodiment of the disclosure.

FIG. 4 is a circuit diagram illustrating a memory block included in a memory cell array according to an exemplary embodiment of the disclosure.

Referring to FIG. 4, the memory cell array (for example, 110 of FIG. 2) may be a memory cell array of a horizontal NAND flash memory and may include a plurality of memory blocks. Each memory block BLKa may include n (n is an integer of no less than 2) cell strings STR in which memory cells MC1 through MCn, ground selection transistor GST, and string selection transistor SST are serially connected between bit lines BL0 to BLm-1 and common source line CSL in the direction of bit lines BL0 to BLm-1. For example, in FIG. 4, an example in which each of the cell strings STR includes 8 or more memory cells is illustrated. The memory cells MC1 through MCn may be controlled through word lines WL1 through WLn, the ground selection transistor GST may be controlled through a ground selection line GSL, and the string selection transistor SST may be selected through a string selection line SSL.

In the NAND flash memory device having the structure of FIG. 4, erasing is performed in units of blocks and programming is performed in units of pages corresponding to word lines WL1 to WLn. FIG. 4 illustrates an example in which n pages for n word lines WL1 to WLn are provided in one block. In addition, the non-volatile memory device 10 of FIGS. 1 and 2 may include a plurality of memory cell arrays that perform the same operation as that of the memory cell array 110 described above with the same structure as that of the memory cell array 110 described above.

Figure 5:
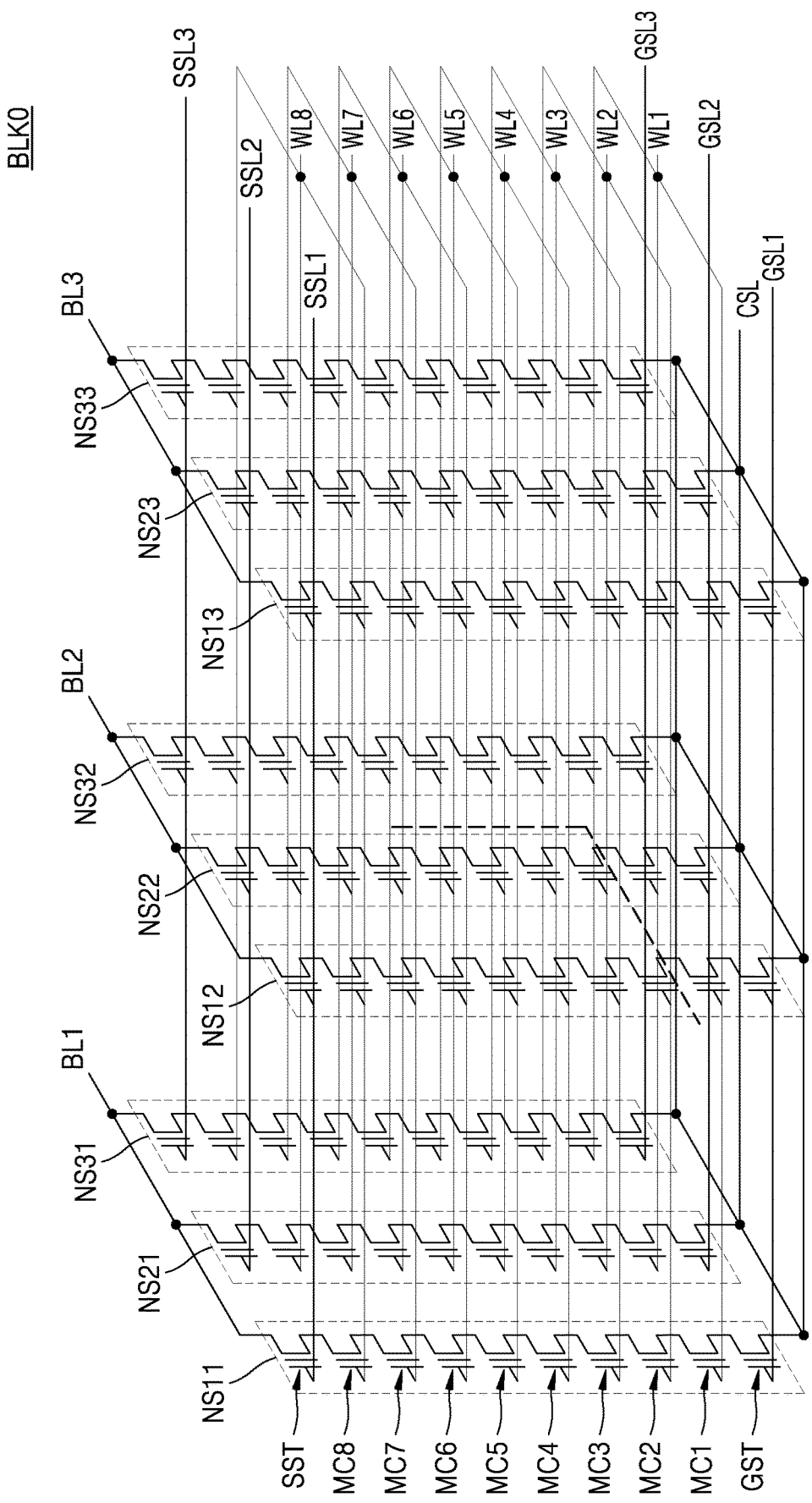
FIG. 5 is a circuit diagram illustrating another example of a memory block included in a memory cell array according to an exemplary embodiment of the disclosure.

FIG. 5 is a circuit diagram illustrating another example of a memory block included in a memory cell array according to an exemplary embodiment of the disclosure.

Referring to FIG. 5, the memory cell array (for example, 110 of FIG. 2) may be a memory cell array of a vertical NAND flash memory and may include a plurality of memory blocks. Each memory block BLK0 may include a plurality of cell strings NS11 to NS33, a plurality of word lines WL1 to WL8, a plurality of bit lines BL1 to BL3, a plurality of ground selection lines GSL1 to GSL3, a plurality of cell string selection lines SSL1 to SSL3, and a common source line CSL. Here, the number of NAND cell strings, the number of word lines, the number of bit lines, the number of ground selection lines, and the number of cell string selection lines may vary in accordance with an embodiment.

The NAND cell strings NS11, NS21, and NS31 are provided between a first bit line BL1 and the common source line CSL. The NAND cell strings NS12, NS22, and NS32 are provided between a second bit line BL2 and the common source line CSL. The NAND cell strings NS13, NS23, and NS33 are provided between a third bit line BL3 and the common source line CSL. Each NAND cell string (for example, NS11) may include a serially connected cell string selection transistor SST, a plurality of memory cells MC1 to MC8, and a ground selection transistor GST.

NAND cell strings commonly connected to a bit line configure a column. For example, the NAND cell strings NS11, NS21, and NS31 commonly connected to the first bit line BL1 correspond to a first column, the NAND cell strings NS12, NS22, and NS32 commonly connected to the second bit line BL2 correspond to a second column, and the NAND cell strings NS13, NS23, and NS33 commonly connected to the third bit line BL3 may correspond to a third column.

Cell strings connected to a cell string selection line configure a row. For example, the NAND cell strings NS11, NS12, and NS13 connected to the first cell string selection line SSL1 correspond to a first row, the NAND cell strings NS21, NS22, and NS23 connected to the second cell string selection line SSL2 correspond to a second row, and the NAND cell strings NS31, NS32, and NS33 connected to the third cell string selection line SSL3 may correspond to a third row.

The cell string selection transistor SST is connected to the corresponding cell string selection lines SSL1 to SSL3. The plurality of memory cells MC1 to MC8 are respectively connected to the corresponding word lines WL1 to WL8. The ground selection transistor GST is connected to the corresponding ground selection lines GSL1 to GSL3. The cell string selection transistor SST is connected to the corresponding bit lines BL1 to BL3 and the ground selection transistor GST is connected to the common source line CSL.

A word line (for example, WL1) of the same height is commonly connected, the cell string selection lines SSL1 to SSL3 are separate from each other, and the ground selection lines GSL1 to GSL3 are separate from each other. For example, when memory cells that are connected to the first word line WL1 and belong to the cell strings NS11, NS12, and NS13 are programmed, the first word line WL1 and the first cell string selection line SSL1 are selected. The ground selection lines GSL1 to GSL3 may be commonly connected to each other.

Figure 6:
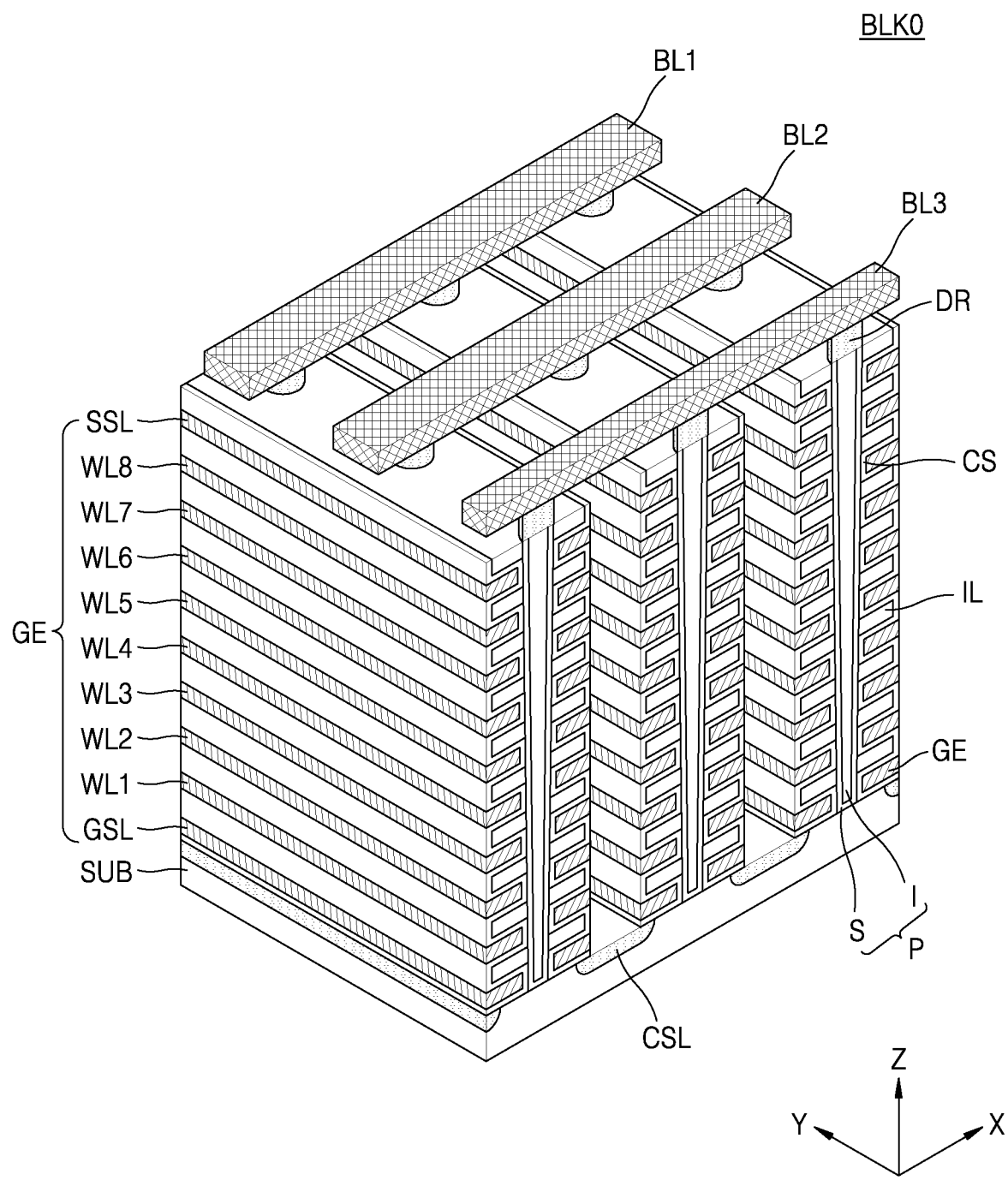
FIG. 6 is a perspective view illustrating a memory block BLK0.

FIG. 6 is a perspective view illustrating a memory block BLK0.

Referring to FIG. 6, each memory block included in the memory cell array (for example, 110 of FIG. 2) is formed in a vertical direction with respect to a substrate SUB. In FIG. 6, it is illustrated that a memory block includes the two selection lines GSL and SSL, the 8 word lines WL1 to WL8, and the 3 bit lines BL1 to BL3. However, the memory block may include more or less selection lines, word lines, and bit lines.

The substrate SUB has a first conductivity type (for example, a p type). Common source lines CSL extending in a first direction (for example, a Y direction) and doped with impurities of a second conductivity type (for example, an n type) are provided on the substrate SUB. On a region of the substrate SUB between two adjacent common source lines CSL, a plurality of insulating layers IL extending in the first direction are sequentially provided in a third direction (for example, a Z direction) and the plurality of insulating layers IL are spaced apart from each other by a certain distance in the third direction. For example, the plurality of insulating layers IL may include an insulating material such as a silicon oxide.

On the region of the substrate SUB between the two adjacent common source lines CSL, a plurality of pillars P sequentially arranged in the first direction and passing through the plurality of insulating layers IL in the third direction are provided. For example, the plurality of pillars P pass through the plurality of insulating layers IL and contact the substrate SUB. In detail, a surface layer S of each pillar P may include a silicon material having a first type and may function as a channel region. On the other hand, an internal layer I of each pillar P may include the insulating material such as a silicon oxide or an air gap.

In the region between the two adjacent common source lines CSL, a charge storage layer CS is provided along exposed surfaces of the insulating layers IL, the pillars P, and the substrate SUB. The charge storage layer CS may include a gate insulating layer (or referred to as 'a tunneling insulting layer'), a charge trap layer, and a blocking insulating layer. For example, the charge storage layer CS may have an oxide-nitride-oxide (ONO) structure. In addition, in the region between the two adjacent common source lines CSL, on an exposed surface of the charge storage layer CS, a gate electrode GE such as the selection lines GSL and SSL and the word lines WL1 to WL8 is provided.

Drains or drain contacts DR are respectively provided on the plurality of pillars P. For example, the drains or the drain contacts DR may include a silicon material doped with impurities of the second conductivity type. On the drains DR, the bit lines BL1 to BL3 extending in a second direction (for example, an X direction) and spaced apart from each other by a certain distance in the first direction are provided.

Figure 7:
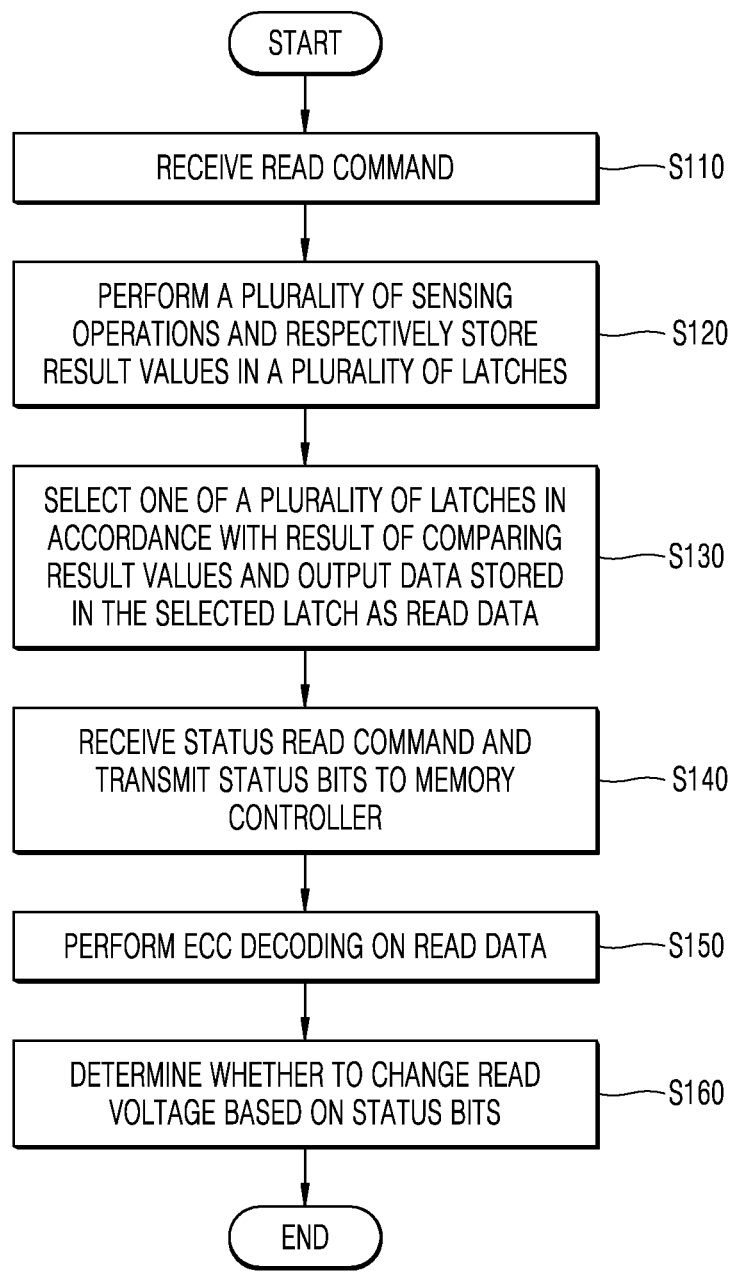
FIG. 7 is a flowchart illustrating a method of operating a storage device, according to an exemplary embodiment of the disclosure.

FIG. 7 is a flowchart illustrating a method of operating a storage device, according to an exemplary embodiment of the disclosure.

Referring to FIG. 7, the non-volatile memory device 10 included in the storage device 1 may receive the read command CMD_r in operation S110. For example, the memory controller 20 receives a read request from the host HOST connected to the storage device 1 and may transmit the read command CMD_r to the non-volatile memory device 10 in response to the received read request.

In operation S120, the non-volatile memory device 10 performs the plurality of sensing operations and may respectively store the result values in the plurality of latches. According to various embodiments, the non-volatile memory device 10 may perform the plurality of sensing operations based on the OVS module 130 in response to the received read command CMD_r.

In operation S130, the non-volatile memory device 10 of the storage device 1 selects one of the plurality of latches in accordance with a result of comparing the result values and may output data stored in the selected latch as the read data. The non-volatile memory device 10 compares data values stored in the latches and may select data stored in one of the plurality of latches in accordance with the comparison result values.

In operation S140, the non-volatile memory device 10 of the storage device 1 receives the status read command and may transmit the status bits to the memory controller 20. The status read command may request information for the memory controller 20 determining a state of the non-volatile memory device 10. For example, when the status read command is received while the OVS read operation is performed, the non-volatile memory device 10 may transmit the status bits that represent "busy" to the memory controller 20. For example, when the OVS read operation is completed and the status read command is received, the non-volatile memory device 10 may transmit the status bits that represent "ready" to the memory controller 20. When the non-volatile memory device 10 is in a "ready" state, the status bits may further include bits that represent a latch selected to output the read data among the plurality of latches.

In operation S150, the memory controller 20 of the storage device 1 may perform the ECC decoding on the read data. The memory controller 20 receives the read data and may perform the ECC decoding based on the ECC module 210. Detailed description of the ECC decoding may be made with reference to description of the ECC module 210 of FIG. 1.

In operation S160, when the ECC decoding is successfully performed, the memory controller 20 of the storage device 1 may determine whether to change the read voltage based on the status bits. When the ECC decoding is successfully performed, the memory controller 20 may output the decoded read data to the host HOST. In an embodiment according to the disclosure, the memory controller 20 identifies the latch selected to output the read data and may determine whether to change the read voltage based on the status bits received from the non-volatile memory device 10, as described later with reference to FIGS. 10 and 11.

Figure 8:
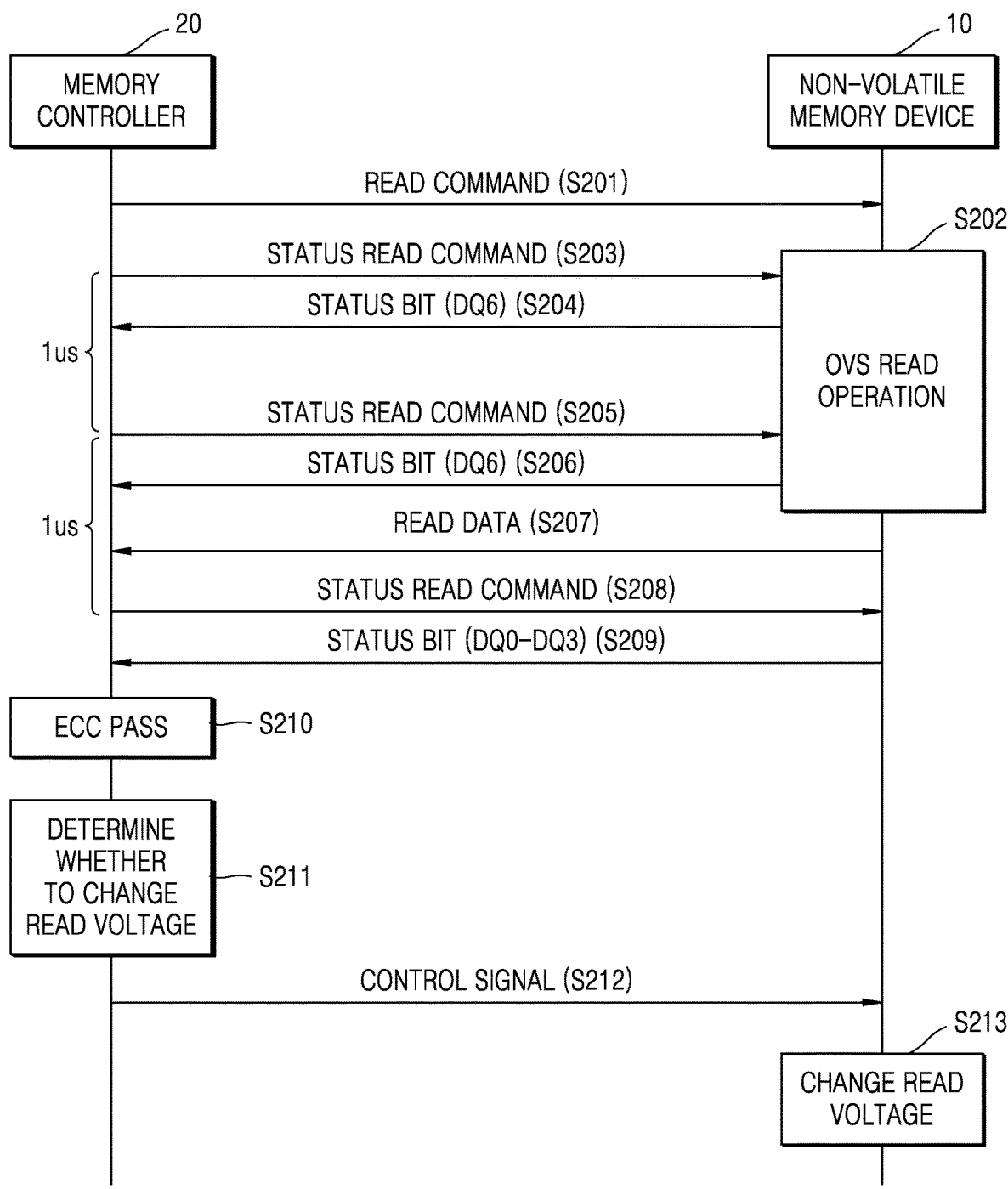
FIG. 8 is a signal exchange diagram between a memory controller and a non-volatile memory device according to an exemplary embodiment of the disclosure.

FIG. 8 is a signal exchange diagram between a memory controller and a non-volatile memory device according to an exemplary embodiment of the disclosure. Descriptions that are the same as those already given with reference to FIG. 7 are omitted.

Referring to FIG. 8, when the memory controller 20 transmits the read command CMD_r to the non-volatile memory device 10 in operation S201, the non-volatile memory device 10 may perform the OVS read operation in response to the read command CMD_r in operation S202. According to various embodiments, the non-volatile memory device 10 may be in a busy or ready state. For example, while performing the OVS read operation, the non-volatile memory device 10 may be in the "busy" state. The "busy" state may refer to a period in which data is latched to the page buffer 120 while the non-volatile memory device 10 performs the OVS read operation. For example, when the OVS read operation is completed, the non-volatile memory device 10 may be in the "ready" state. The "ready" state may refer to a period in which the OVS read operation is completed and the data is not latched to the page buffer 120.

The memory controller 20 may transmit the status read command to the non-volatile memory device 10 in operation S203. The status read command may request the information for determining the state of the non-volatile memory device 10. The status read command may be referred to as CMD_70. The status read command may be periodically transmitted to the non-volatile memory device 10 after a specific period of time from a point of time at which the read command CMD_r is transmitted. According to an embodiment, the status read command may be transmitted from the memory controller 20 to the non-volatile memory device 10 every 1 us period. However, the disclosure is not limited thereto. The status read command may be transmitted to the non-volatile memory device 10 in a period different from the 1 us period. For example, in the storage device 1 that operates based on a high-speed clock, the status read command may be transmitted in a shorter period than the 1 us period. For example, in the storage device 1 that operates based on a low-speed clock, the status read command may be transmitted every period longer than the 1 us period.

The non-volatile memory device 10 may transmit the status bits to the memory controller 20 in response to the received status read command in operation S204. The status bits may include bits for indicating a state of the non-volatile memory device 10. The status bits may be transmitted through at least one pin among pins DQ0 to DQ7. For example, when the non-volatile memory device 10 is in the "busy" state, the non-volatile memory device 10 may transmit a status bit "1" through the pin DQ6. For example, when the non-volatile memory device 10 is in the "ready" state, the non-volatile memory device 10 may transmit a status bit "0" through the pin DQ6. Referring to FIG. 8, while performing the OVS read operation, the non-volatile memory device 10 receives the status read command twice and may transmit the status bit "1" through the pin DQ6. The memory controller 20 may determine that the non-volatile memory performs the OVS read operation through the status bit "1" received through the pin DQ6. According to various embodiments, the non-volatile memory device 10 may transmit the status read command again in operation S205. When the non-volatile memory device 10 performs the OVS read operation, the non-volatile memory device 10 may repeatedly transmit the status bits representing that the non-volatile memory device 10 is still in the "busy" state in operation S206.

The non-volatile memory device 10 completes the OVS read operation and may transmit the read data to the memory controller 20 in operation S207. The read data may be selected through an operation of comparing the data items respectively stored in the plurality of latches through the plurality of sensing operations.

After the OVS read operation is completed, the non-volatile memory device 10 receives the status read command in operation S208 and may transmit the status bits in response to the status read command in operation S209. According to various embodiments, when the non-volatile memory device 10 that performs the OVS read operation is in the "ready" state, the status bits may further include bits transmitted through the pins DQ0 to DQ3. That is, when the non-volatile memory device 10 completes the OVS read operation and transmits the status bits, the non-volatile memory device 10 may represent a result of the OVS operation by transmitting the status bits. According to an embodiment, FIG. 9 illustrates an example of the status bits transmitted through the pins DQ0 to DQ3. In one embodiment, DQ0 and DQ1 may be classified to MAT0. And DQ2 and DQ3 may be classified to MAT1. For example, when the non-volatile memory device 10 is in a first state, the transmitted status bits may be "1010". In the first state, the data stored in the first latch by the first sensing operation is output to the memory controller 20 as the read data. For example, when the non-volatile memory device 10 is in a second state, the transmitted status bits may be "0000". In the second state, the data stored in the second latch by the second sensing operation is output to the memory controller 20 as the read data. For example, when the non-volatile memory device 10 is in a third state, the transmitted status bits may be "0101". In the third state, the data stored in the third latch by the third sensing operation is output to the memory controller 20 as the read data. According to various embodiments, the memory controller 20 may determine from which latch the received read data is output among the first latch, the second latch, and the third latch by analyzing the status bits transmitted through the pins DQ0 to DQ3.

The memory controller 20 performs the ECC decoding and may determine ECC PASS in operation S210. The memory controller 20 may perform the ECC decoding based on the read data received from the non-volatile memory device 10. Although not shown in FIG. 8, when the memory controller 20 fails to perform the ECC decoding, the memory controller 20 requests the non-volatile memory device 10 to perform read retry, changes the read voltage, and may receive the read data.

When the ECC decoding is successfully performed on the read data, the memory controller 20 may determine whether to change the read voltage in operation S211. The memory controller 20 performs the ECC decoding on the received read data. When the ECC decoding is successfully performed, since the received read data is errorless or corrected, the memory controller 20 may request the received read data to be output to the host HOST. Simultaneously, the memory controller 20 may determine whether to change the read voltage based on the status bits received from the non-volatile memory device 10 before performing the ECC decoding. The status bits may be transmitted through the pins DQ0 to DQ3. The memory controller 20 may determine from which latch data is output among the first to third latches with reference to the status bits. The memory controller 20 estimates a distribution movement of threshold voltages by determining the latch that outputs the read data and may determine whether to change the read voltage, as described later with reference to FIGS. 10 and 11. According to various embodiments, when it is determined that the memory controller 20 changes the read voltage, the memory controller 20 may transmit a control signal to the non-volatile memory device 10 in operation S212 and the non-volatile memory device 10 may change the read voltage in response to the control signal in operation S213.

Figure 10:
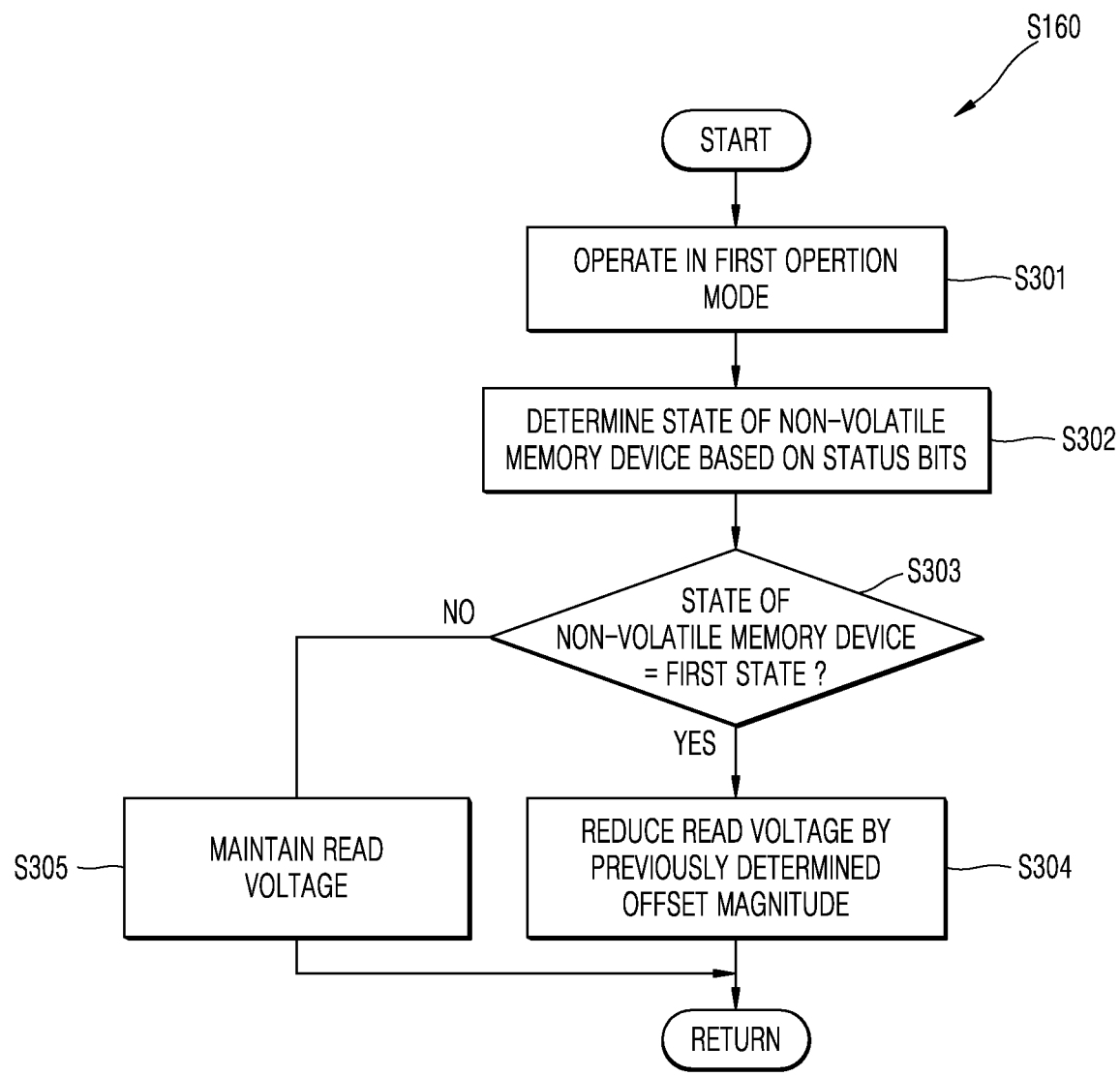
FIG. 10 is a flowchart illustrating a method of operating a storage device that performs a first operation mode, according to an exemplary embodiment of the disclosure.

FIG. 10 is a flowchart illustrating a method of operating a storage device that performs a first operation mode, according to an exemplary embodiment of the disclosure. In detail, FIG. 10 is a flowchart illustrating a detailed operating method of the operation S160 for determining whether to change the read voltage based on the status bits when the ECC decoding of FIG. 7 is successfully performed.

Referring to FIG. 10, in operation S301, the memory controller 20 may operate in the first operation mode. According to an embodiment, the memory controller 20 may operate in the first operation mode or a second operation mode. For example, in the first operation mode, it is determined whether to reduce or maintain the read voltage based on the status bits. The second operation mode will be described in detail with reference to FIG. 11.

The memory controller 20 may be determined to operate in the first mode by referring to a set value associated with an operation mode. According to an embodiment, the set value may be previously set so that the memory controller 20 operates in the first mode or may be changed by a user. According to another embodiment, the set value may be set to periodically switch between the first operation mode and the second operation mode. According to another embodiment, the set value may be adaptively changed so that the memory controller 20 operates in the first operation mode when an amount of overload or overhead of the memory controller 20 is large or is greater than a previously set value and that the memory controller 20 operates in the second operation mode when the amount of overload or overhead of the memory controller 20 is small or less than the previously set value.

In operation S302, the memory controller 20 may determine the state of the non-volatile memory device 10 based on the status bits. After the memory controller 20 transmits the read command, the state bits may be received from the non-volatile memory device 10 in response to the periodically transmitted status read command. For example, after the non-volatile memory device 10 completes the OVS read operation, the memory controller 20 may transmit the status read command to the non-volatile memory device 10. The non-volatile memory device 10 determines that the OVS read operation is completed and may transmit the bit of "0" to the pin DQ6 in response to the status read command. In addition, the non-volatile memory device 10 may further transmit the state bits for determining the result of the OVS read operation through the pins DQ0 to DQ3.

In operation S303, the memory controller 20 may determine whether the non-volatile memory device 10 is in the first state. When the memory controller 20 operates in the first operation mode, it may be determined whether the status bits of the pins DQ0 to DQ3 are "1010". For example, the memory controller 20 performs an XOR operation on the status bits of the pins DQ0 to DQ3 "1010" and may determine whether the result value is "0000". When the status bits are equal to "1010", the memory controller 20 may determine that the data stored in the first latch is output as the read data by the first sensing operation. In addition, the memory controller 20 may determine that the number of cells activated by using the first latch is less than the number of cells activated by using the second latch and the third latch. Hereinafter, a cell activated by using an arbitrary latch may be referred to as an on-cell.

In operation S304, the memory controller 20 may reduce the read voltage by a previously determined offset magnitude. For example, the previously determined offset magnitude may be 0.1V. In the above-described embodiments, the offset magnitude is described as being 0.1V. However, the disclosure is not limited thereto. According to various embodiments, the offset magnitude may be set to have a value different from 0.1V. For example, in a single level cell (SLC)-based non-volatile memory device, since a distance between read voltages by program is large, the offset magnitude may be set to be greater than 0.1V. For example, in a quad level cell (QLC)-based non-volatile memory device, since a distance between read voltages by program is not large, the offset magnitude may be set to be less than 0.1V.

In operation S305, the memory controller 20 may maintain the read voltage. When the status bits do not coincide with "1010", the memory controller 20 may bypass a change in read voltage. When the status bits are not "1010", the memory controller 20 may determine that the read data is output not from the first latch but from the second latch or the third latch. When the read data is not output from the first latch, since the memory controller 20 does not need to reduce the read voltage, the read voltage may be maintained and a process may be terminated.

In FIG. 10, according to the above-described embodiment, since the memory controller 20 determines whether the non-volatile memory device is in the first state based on the status bits, it may be determined only whether to reduce or maintain the read voltage. According to various embodiments, a value of the threshold voltage may be reduced due to retention or may increase. Therefore, the memory controller 20 may be requested to increase the read voltage based on the status bits of the non-volatile memory device 10.

Figure 11:
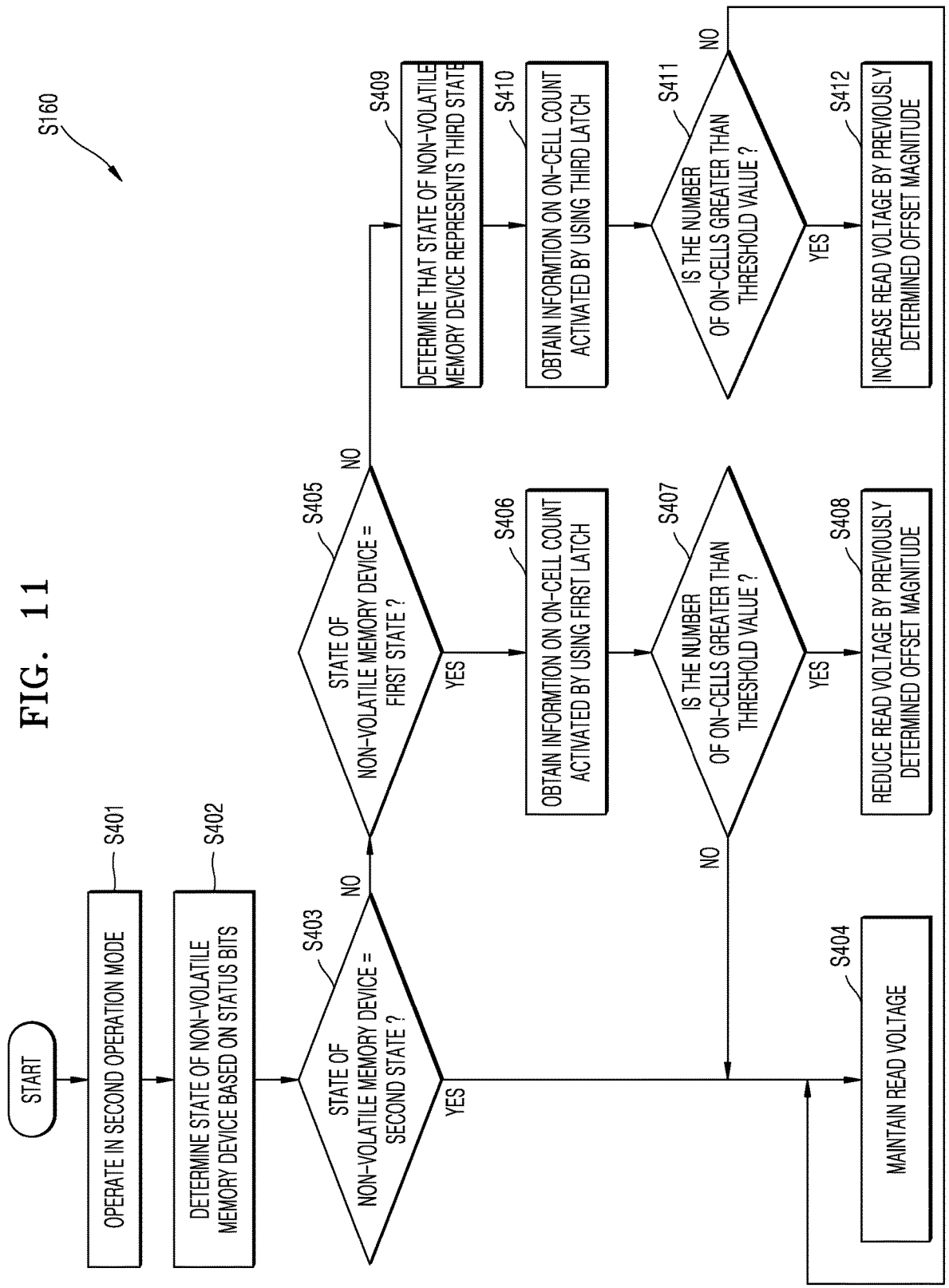
FIG. 11 is a flowchart illustrating a method of operating a storage device that performs a second operation mode, according to an exemplary embodiment of the disclosure.

FIG. 11 is a flowchart illustrating a method of operating a storage device that performs a second operation mode, according to an exemplary embodiment of the disclosure. In detail, FIG. 11 is a flowchart illustrating a detailed operating method of the operation S160 for determining whether to change the read voltage based on the status bits when the ECC decoding of FIG. 7 is successfully performed.

Referring to FIG. 11, in operation S401, the memory controller 20 may operate in the second operation mode. In the second operation mode, based on the status bits, it is determined whether to reduce or increase the read voltage. That is, when the memory controller 20 operates in the second operation mode, it may be determined whether to reduce, maintain, or increase the read voltage.

In operation S402, the memory controller 20 may determine the state of the non-volatile memory device 10 based on the status bits. Operation S402 may correspond to operation S302 of FIG. 10.

In operation S403, the memory controller 20 may determine whether the non-volatile memory device 10 is in the second state. According to various embodiments, while the memory controller 20 operates in the second operation mode, it may be determined whether the status bits of the pins DQ0 to DQ3 are "0000". For example, the memory controller 20 performs an XOR operation on the status bits of the pins DQ0 to DQ3 "0000" and may determine whether the result value is "0000". When the status bits are equal to "0000", the memory controller 20 may determine that the data stored in the second latch is output as the read data by the second sensing operation. In addition, the memory controller 20 may determine that the number of on-cells activated by using the second latch is less than the number of on-cells activated by using the first latch and the third latch.

In operation S404, the memory controller 20 may maintain the read voltage. When the non-volatile memory device 10 is in the second state, the read data may be output from the second latch. When the previously set read voltage corresponds to a valley in a distribution graph of the threshold voltage, the data stored in the second latch may be output as the read data. Therefore, the memory controller 20 determines that the previously set read voltage is an ideal read voltage and may bypass a change in read voltage.

In operation S405, the memory controller 20 may determine whether the non-volatile memory device 10 is in the first state. For example, the memory controller 20 performs an XOR operation on the received status bits "1010" and may determine whether the non-volatile memory device 10 is in the first state.

In operation S406, the memory controller 20 may obtain cell-count information activated by using the first latch. When the status bits represent the first state, the memory controller 20 may determine that a voltage lower than the previously set read voltage is the ideal read voltage. Although the ECC decoding is successfully performed, in a case in which the read voltage is changed whenever the status bits represent the first state, the performance of the read operation may deteriorate. Therefore, the memory controller 20 may transmit a command for requesting information on the number of memory cells activated by using the first latch to the non-volatile memory device 10. The command may be referred to as a universal internal bus (UIB) OUT command. The memory controller 20 may obtain the information on the number of memory cells activated by using the first latch, which is transmitted from the non-volatile memory device 10, in response to the command.

In operation S407, the memory controller 20 may determine whether the number of on-cells is greater than a threshold value. The threshold value may be previously determined as an arbitrary proper value considering the deterioration of the read performance caused by a frequent change in read voltage and improvement of the read performance caused by maintaining the ideal read voltage.

In operation S408, the memory controller 20 may reduce the read voltage by a previously determined offset magnitude. When the number of on-cells is greater than the threshold value, although the ECC decoding is successfully performed, since the read data is close to limitations on ECC error correction, the memory controller 20 may determine to reduce the read voltage in advance to an occurrence of ECC error. As described above, the previously determined offset magnitude may correspond to 0.1V. However, the disclosure is not limited thereto.

In operation S409, the memory controller 20 may determine that the non-volatile memory device 10 is in the third state. Since the memory controller 20 determines that the non-volatile memory device 10 is not in the first state and the second state by performing operation S403 and operation S405, an XOR operation for determining whether the status bits represent the third state may be omitted.

In operation S410, the memory controller 20 may obtain on-cell count information activated by using the third latch. When the status bits represent the third state, the memory controller 20 may determine that a voltage higher than the set read voltage is the ideal read voltage. Although the ECC decoding is successfully performed, in a case in which the read voltage is changed whenever the status bits represent the third state, the performance of the read operation may deteriorate. Therefore, the memory controller 20 transmits a command for requesting information on the number of on-cells activated by using the third latch to the non-volatile memory device 10 and may obtain the information on the number of on-cells. The command may be referred to as the UIB OUT command.

In operation S411, the memory controller 20 may determine whether the number of on-cells is greater than a threshold value. The threshold value may be previously determined as an arbitrary proper value considering the deterioration of the read performance caused by a frequent change in read voltage and improvement of the read performance caused by maintaining the ideal read voltage.

In operation S412, the memory controller 20 may increase the read voltage by a previously determined offset magnitude. Description of operation S412 may be replaced by the description of operation S408.

According to an embodiment described above with reference to FIG. 11, when it is determined that the non-volatile memory device 10 is in the first state or the third state based on the status bits, the memory controller 20 may transmit a command for requesting information on the number of activated memory cells to the non-volatile memory device 10.

Whenever the read operation is performed, in order to determine whether to change the read voltage, transmitting the command and receiving the information on the number of activated memory cells may operate as overhead in the memory controller 20 and the non-volatile memory device 10. Therefore, in order to reduce the overhead, a method of omitting the command for requesting the information on the number of activated memory cells may be requested.

FIG. 12 is a table illustrating status bits according to an exemplary embodiment of the disclosure.

As described above with reference to FIG. 9, the status bits for representing a latch selected to output the read data among the plurality of latches may be transmitted from the non-volatile memory device 10 to the memory controller 20 through the pins DQ0 to DQ3. Hereinafter, the status bit transmitted through the pin DQ0 may be referred to as the first bit, the status bit transmitted through the pin DQ1 may be referred to as the second bit, the status bit transmitted through the pin DQ2 may be referred to as the third bit, and the status bit transmitted through the pin DQ3 may be referred to as the fourth bit.

Referring to FIG. 12, the state of the non-volatile memory device 10 may be represented as a combination of the first bit and the second bit. For example, the first state of the non-volatile memory device 10 may be represented through a first bit and a second bit of "10". For example, the second state of the non-volatile memory device 10 may be represented through a first bit and a second bit of "01". For example, the third state of the non-volatile memory device 10 may be represented through a first bit and a second bit of "00". The logic value of the first bit and the second bit that represents each state is not limited thereto.

Referring to FIG. 12, a third bit may determine whether to reduce the read voltage when the non-volatile memory device 10 is in the first state. According to various embodiments, the third bit may represent a result of comparing the number of on-cells activated by using the first latch with the threshold value. For example, when the third bit has a logic value "0", it may be determined that the threshold value is greater than the number of on-cells activated by using the first latch. For example, when the third bit has a logic value "1", it may be determined that the number of on-cells activated by using the first latch is greater than the threshold value.

Referring to FIG. 12, a fourth bit may determine whether to increase the read voltage when the non-volatile memory device 10 is in the third state. According to various embodiments, the fourth bit may represent a result of comparing the number of on-cells activated by using the third latch with the threshold value. For example, when the fourth bit has a logic value "0", it may be determined that the threshold value is greater than the number of on-cells activated by using the third latch. For example, when the fourth bit has a logic value "1", it may be determined that the number of on-cells activated by using the third latch is greater than the threshold value.

In the above-described embodiment, it is illustrated that the state of the non-volatile memory device 10 is represented through a combination of the first bit and the second bit, that it is determined whether to reduce the read voltage when it is determined that the non-volatile memory device 10 is in the first state through the third bit, and that it is determined whether to increase the read voltage when it is determined that the non-volatile memory device 10 is in the third state through the fourth bit. However, the disclosure is not limited thereto. According to various embodiments, the non-volatile memory device 10 may be set by a reserved bit without using the first bit and the second bit. In this case, the non-volatile memory device 10 may simultaneously represent the first state of the non-volatile memory device 10 and reduction in the read voltage by setting the third bit as "1" and may simultaneously represent the third state of the non-volatile memory device 10 and increase in the read voltage by setting the fourth bit as "1".

Figure 13:
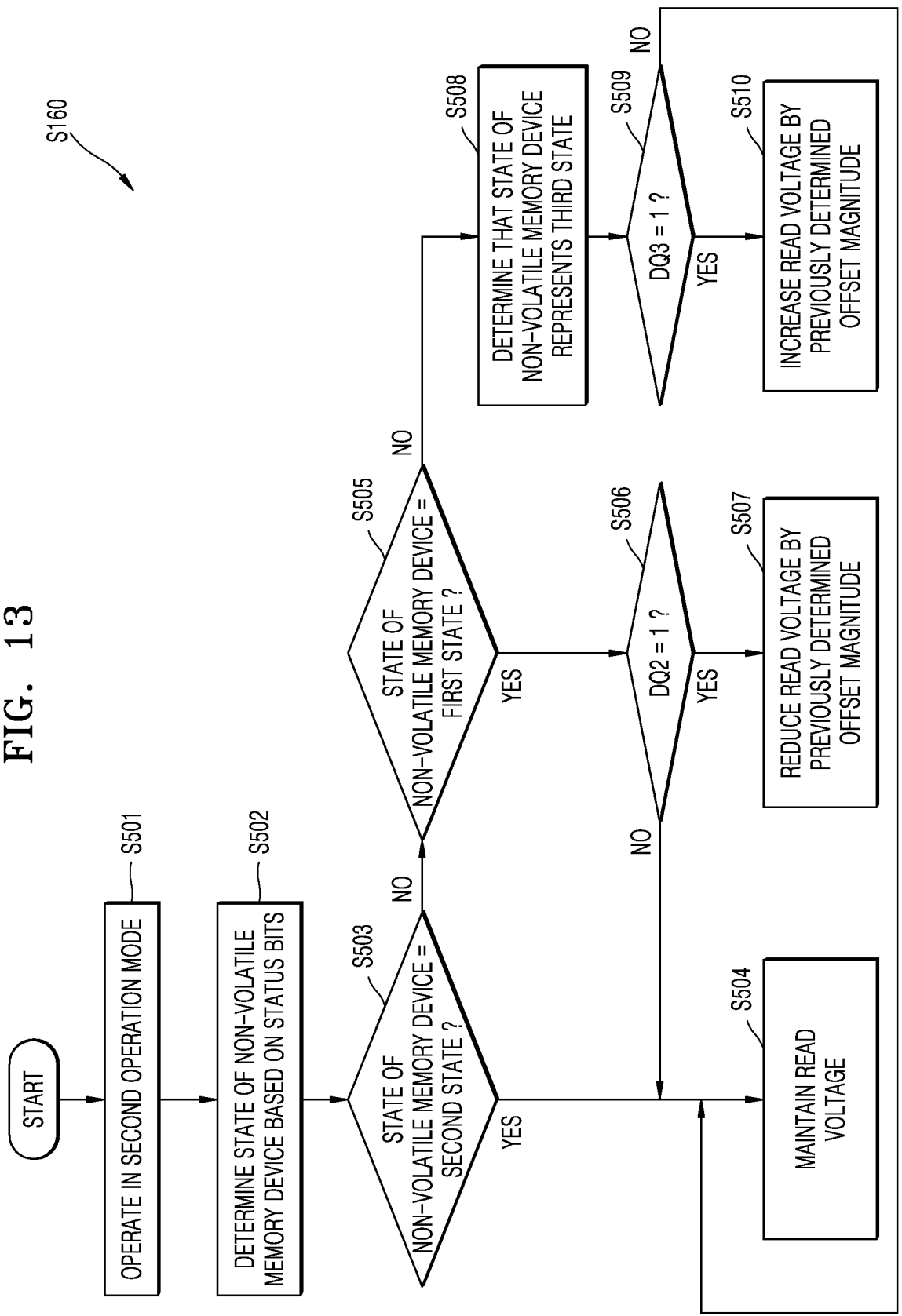
FIG. 13 is a flowchart illustrating a method of operating a storage device that performs a second operation mode based on changed status bits, according to an exemplary embodiment of the disclosure.

FIG. 13 is a flowchart illustrating a method of operating a storage device that performs a second operation mode based on changed status bits, according to an exemplary embodiment of the disclosure. Descriptions that are the same as those already given with reference to FIG. 11 are omitted.

In operation S501, the memory controller 20 may operate in the second operation mode. The memory controller 20 may operate in the second operation mode with reference to a set value for an operation mode. Operation S501 may correspond to operation S401 of FIG. 11.

In operation S502, the memory controller 20 may determine the state of the non-volatile memory device 10 based on the status bits. The status bits may correspond to the changed status bits of FIG. 12. For example, when the memory controller 20 receives the changed status bits, the state of the non-volatile memory device 10 may be determined with reference to the first bit and the second bit.

In operation S503, the memory controller 20 may determine whether the non-volatile memory device 10 is in the second state. For example, when the changed status bits are received, the memory controller 20 may determine that the non-volatile memory device 10 is in the second state by performing an XOR operation on the first bit and the second bit having a logic value "00".

In operation S504, the memory controller 20 may maintain the read voltage. When the first bit and the second bit have the logic value "00", the memory controller 20 may determine that the non-volatile memory device 10 is in the second state. Data is read by the previously set read voltage. Since the number of activated memory cells is the smallest, the memory controller 20 may determine the previously set read voltage as the ideal read voltage. Therefore, the memory controller 20 maintains the read voltage and may bypass a change in read voltage.

In operation S505, the memory controller 20 may determine whether the non-volatile memory device 10 is in the first state. For example, when the changed status bits are received, the memory controller 20 may determine that the non-volatile memory 10 is in the first state by performing an XOR operation on the first bit and the second bit having a logic value "10".

In operation S506, the memory controller 20 may determine whether the status bit transmitted through the pin DQ2 is "1". After determining that the non-volatile memory device 10 is in the first state, in order to determine whether to reduce the read voltage, the memory controller 20 may determine the logic value of the status bit transmitted through the pin DQ2. According to various embodiments, the memory controller 20 may bypass transmission of the command for requesting the information on the number of memory cells activated by using the first latch by receiving the changed status bit and determining a value of the status bit transmitted through the pin DQ2, which is because the status bit of the pin DQ2 of the changed status bit directly represents a result of comparing the number of memory cells activated by using the first latch with the threshold value. Therefore, when the changed status bit is used, the memory controller 20 may not transmit the UIB OUT command to the non-volatile memory device 10 and omits an operation of comparing the number of memory cells activated by using the first latch with the threshold value. Accordingly, overhead caused by signalling between the memory controller 20 and the non-volatile memory device 10 may be reduced.

In operation S507, the memory controller 20 may reduce the read voltage by a previously determined offset magnitude. When the status bit transmitted through the pin DQ2 has the logic value "1", the memory controller 20 may determine to reduce the read voltage. The status bit "1" transmitted through the pin DQ2 may represent that the number of memory cells activated by using the first latch is greater than the threshold value. Therefore, the memory controller 20 may reduce the number of memory cells activated by using the first latch to be no more than the threshold value by setting a voltage reduced by the previously determined offset magnitude as the read voltage.

In operation S508, the memory controller 20 may determine whether the non-volatile memory device 10 is in the third state. Detailed description of operation S508 will be made with reference to operation S409 of FIG. 11.

In operation S509, the memory controller 20 may determine whether the status bit transmitted through the pin DQ3 is "1". After determining that the non-volatile memory device 10 is in the third state, in order to determine whether to increase the read voltage, the memory controller 20 may determine the logic value of the status bit transmitted through the pin DQ3. According to various embodiments, the memory controller 20 may bypass transmission of the command for requesting the information on the number of memory cells activated by using the third latch by receiving the changed status bit and determining a logic value of the status bit transmitted through the pin DQ3, which is because the status bit of the pin DQ3 of the changed status bit directly represents a result of comparing the number of memory cells activated by using the third latch with the threshold value. Therefore, when the changed status bit is used, the memory controller 20 may not transmit the UIB OUT command to the non-volatile memory device 10 and omits an operation of comparing the number of memory cells activated by using the third latch with the threshold voltage value. Accordingly, overhead caused by signalling between the memory controller 20 and the non-volatile memory device 10 may be reduced.

In operation S510, the memory controller 20 may increase the read voltage by a previously determined offset magnitude. Detailed description of the operation S510 will be performed with reference to the operation S412 of FIG. 11.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:
1. A storage device comprising:
 a memory controller; and
 a non-volatile memory device, wherein the non-volatile memory device comprises:

a memory cell array including a plurality of memory cells;

a page buffer including a plurality of latches for performing a plurality of sensing operations on selected memory cells among the plurality of memory cells and storing result values of the plurality of sensing operations;

a control logic for comparing data stored in each of the plurality of latches, selecting a selected latch from among the plurality of latches in accordance with a result of the comparing of the data, transmitting read data stored in the selected latch to the memory controller, and generating status bits representing the selected latch from among the plurality of latches; and a status bit register for storing the status bits and transmitting the status bits to the memory controller when a status read command is received from the memory controller, wherein the memory controller performs an error correction code (ECC) decoding on the read data and determines whether to change a read voltage based on the status bits when the ECC decoding is successfully performed.

2. The storage device of claim 1, wherein:

the plurality of sensing operations is performed at different points in time, and the plurality of latches comprises:

a first latch for storing sensed data in accordance with a sensing operation performed on the selected memory cells at a first point of time;

a second latch for storing sensed data in accordance with a sensing operation performed on the selected memory cells at a second point of time later than the first point of time; and a third latch for storing sensed data in accordance with a sensing operation performed on the selected memory cells at a third point of time later than the second point of time.

3. The storage device of claim 2, wherein the memory controller operates in one of a first operation mode in which it is determined whether to reduce or maintain the read voltage and a second operation mode in which it is determined whether to reduce, maintain, or increase the read voltage.

4. The storage device of claim 3, wherein:

the memory controller determines whether the non-volatile memory device is in a first state while the memory controller operates in the first operation mode and reduces the read voltage by a previously determined offset magnitude, and in the first state, the read data is output from the first latch.

5. The storage device of claim 3, wherein:

the memory controller determines whether the status bits represent a second state while the memory controller operates in the second operation mode and bypasses a change in read voltage based on the second state when the status bits represent the second state, and in the second state, the read data is output from a second latch.

6. The storage device of claim 5, wherein the memory controller:

determines whether the status bits represent a first state, transmits a command for requesting information on a number of memory cells activated by using a first latch to the non-volatile memory device when the status bits represent the first state, compares the number of memory cells activated by using the first latch with a threshold value, reduces the read voltage by a previously determined offset magnitude when the number of memory cells activated by using the first latch is greater than the threshold value, and bypasses a change in read voltage when the threshold value is greater than the number of memory cells activated by using the first latch.

7. The storage device of claim 6, wherein the memory controller:

determines that the status bits represent a third state, transmits a command for requesting information on a number of memory cells activated by using a third latch to the non-volatile memory device, compares the number of memory cells activated by using the third latch with a threshold value, increases the read voltage by the previously determined offset magnitude when the number of memory cells activated by using the third latch is greater than the threshold value, and bypasses a change in read voltage when the threshold value is greater than the number of memory cells activated by using the third latch.

8. The storage device of claim 2, wherein:

the status bits comprise a first bit, a second bit, a third bit, and a fourth bit, the first bit and the second bit represent one of first to third states, the third bit represents a result of comparing a threshold value with a number of memory cells activated by using the first latch when the non-volatile memory device is in the first state, and the fourth bit represents a result of comparing the threshold value with a number of memory cells activated by using the third latch when the non-volatile memory device is in the third state.

9. The storage device of claim 8, wherein the memory controller determines whether to reduce the read voltage by a previously determined offset magnitude based on the third bit and determines whether to increase the read voltage by the previously determined offset magnitude based on the fourth bit.

10. A memory controller comprising:

an error correction code (ECC) module for performing ECC decoding based on read data received from a non-volatile memory device for performing an on-chip valley search (OVS) read operation; and a read voltage modification module for receiving status bits representing a latch that latches the read data among a plurality of latches included in the non-volatile memory device to store result values of the OVS read operation and determining whether to change a read voltage based on the status bits when the ECC decoding is successfully performed.

11. The memory controller of claim 10, wherein:

the read voltage modification module determines whether the status bits represent a first state when the memory controller operates in a first operation mode in which it is determined whether to reduce or maintain the read voltage and reduces the read voltage by a previously determined offset magnitude based on the first state when the status bits represent the first state, and in the first state, the read data is output from a first latch among the plurality of latches.

12. The memory controller of claim 10, wherein:
the read voltage modification module determines whether the status bits represent a second state when the memory controller operates in a second operation mode in which it is determined whether to reduce, maintain, or increase the read voltage and bypasses a change in read voltage based on the second state when the status bits represent the second state, and
in the second state, the read data is output from a second latch among the plurality of latches.

13. The memory controller of claim 12, wherein the read voltage modification module:
determines whether the status bits represent a first state,
transmits a command for requesting information on a number of memory cells activated by using a first latch among the plurality of latches to the non-volatile memory device when the status bits represent the first state,
compares the number of memory cells activated by using the first latch with a threshold value,
reduces the read voltage by a previously determined offset magnitude when the number of memory cells activated by using the first latch is greater than the threshold value, and
bypasses a change in read voltage when the threshold value is greater than the number of memory cells activated by using the first latch.

14. The memory controller of claim 13, wherein the memory controller:
determines that the status bits represent a third state,
transmits a command for requesting information on the number of memory cells activated by using a third latch among the plurality of latches to the non-volatile memory device,
compares the number of memory cells activated by using the third latch with a threshold value,
increases the read voltage by the previously determined offset magnitude when the number of memory cells activated by using the third latch is greater than the threshold value, and
bypasses a change in read voltage when the threshold value is greater than the number of memory cells activated by using the third latch.

15. The memory controller of claim 14, wherein:
the status bits comprise a first bit, a second bit, a third bit, and a fourth bit,
the first bit and the second bit represent one of first to third states,
the third bit represents a result of comparing a threshold value with the number of memory cells activated by using the first latch when the non-volatile memory device is in the first state, and
the fourth bit represents a result of comparing the threshold value with the number of memory cells activated by using the third latch when the non-volatile memory device is in the third state.

16. The memory controller of claim 15, wherein the read voltage modification module determines whether to reduce the read voltage by a previously determined offset magnitude based on the third bit and determines whether to increase the read voltage by the previously determined offset magnitude based on the fourth bit.

17. A method of operating a memory controller, the method comprising:
receiving read data and status bits representing a latch from which the read data is output among a plurality of latches from a non-volatile memory device for performing an on-chip valley search (OVS) read operation;
performing error correcting code (ECC) decoding based on the read data; and
determining whether to change a read voltage based on the status bits when the ECC decoding is successfully performed.

18. The method of claim 17, wherein:
the memory controller operates in one of a first operation mode in which it is determined whether to reduce or maintain the read voltage and a second operation mode in which it is determined whether to reduce, maintain, or increase the read voltage, and
the determining of whether to change the read voltage comprises:
determining whether the status bits represent a first state when the memory controller operates in the first operation mode; and
reducing the read voltage by a previously determined offset magnitude when the status bits represent the first state.

19. The method of claim 18, wherein the determining of whether to change the read voltage comprises:
determining whether the status bits represent a second state when the memory controller operates in the second operation mode;
bypassing a change in read voltage when the status bits represent the second state;
transmitting a command for requesting information on a number of memory cells activated by using a first latch to the non-volatile memory device when the status bits represent a first state; and
transmitting a command for requesting information on a number of memory cells activated by using a third latch to the non-volatile memory device when the status bits represent a third state.

20. The method of claim 19, wherein the determining of whether to change the read voltage comprises:
comparing the number of memory cells activated by using the first latch with a threshold value when the status bits represent the first state;
reducing the read voltage by the previously determined offset magnitude when the number of memory cells activated by using the first latch is greater than the threshold value;
comparing the number of memory cells activated by using the third latch with the threshold value when the status bits represent the third state; and
increasing the read voltage by the previously determined offset magnitude when the number of memory cells activated by using the third latch is greater than the threshold value.

* * * * *